US012684688B2

(12) United States Patent
Tsuyutani et al.

(10) Patent No.: US 12,684,688 B2
(45) Date of Patent: Jul. 14, 2026

(54) ELECTRONIC COMPONENT EMBEDDED SUBSTRATE AND MANUFACTURING METHOD THEREFOR

(71) Applicant: TDK Corporation, Tokyo (JP)

(72) Inventors: Kazutoshi Tsuyutani, Tokyo (JP); Naoyuki Ishikawa, Tokyo (JP); Takuro Aoki, Tokyo (JP); Reo Hanada, Tokyo (JP)

(73) Assignee: TDK Corporation, Tokyo (JP)

( * ) Notice: Subject to any disclaimer, the term of this patent is extended or adjusted under 35 U.S.C. 154(b) by 189 days.

(21) Appl. No.: 18/549,263

(22) PCT Filed: Feb. 22, 2022

(86) PCT No.: PCT/JP2022/007194
§ 371 (c)(1),
(2) Date: Sep. 6, 2023

(87) PCT Pub. No.: WO2022/196262
PCT Pub. Date: Sep. 22, 2022

(65) Prior Publication Data
US 2024/0155765 A1 May 9, 2024

(30) Foreign Application Priority Data
Mar. 19, 2021 (JP) ................................. 2021-046032

(51) Int. Cl.
*H05K 1/03* (2006.01)
*H05K 1/02* (2006.01)
(Continued)

(52) U.S. Cl.
CPC ............. *H05K 1/03* (2013.01); *H05K 1/0298* (2013.01); *H05K 1/182* (2013.01); *H05K 1/185* (2013.01)

(58) Field of Classification Search
CPC ........ H05K 1/03; H05K 1/0298; H05K 1/182; H05K 3/46; H05K 1/0366; H05K 3/4644;
(Continued)

(56) References Cited

U.S. PATENT DOCUMENTS

| | | | |
|---|---|---|---|
| 2006/0272854 A1 | 12/2006 | Yamano | |
| 2008/0296056 A1* | 12/2008 | Kinoshita | .............. H05K 1/183 |
| | | | 29/846 |

(Continued)

FOREIGN PATENT DOCUMENTS

| | | |
|---|---|---|
| JP | 2006-339421 A | 12/2006 |
| JP | 2016-207940 A | 12/2016 |

OTHER PUBLICATIONS

International Search Report issued in corresponding International Patent Application No. PCT/JP2022/007194, dated May 24, 2022, with English translation.

*Primary Examiner* — Steven T Sawyer
(74) *Attorney, Agent, or Firm* — Rimon P.C.

(57) ABSTRACT

To enhance the degree of design freedom of an outermost conductor layer in an electronic component embedded substrate. An electronic component embedded substrate includes conductor layers, insulating layers each of which is positioned between adjacent two of the conductor layers, and an electronic component embedded in the insulating layer. The conductor layer is positioned in the uppermost layer and includes a plurality of terminal electrodes exposed to one surface side. The insulating layers are each made of a core material obtained by impregnating a core with a resin material, while the insulating layers are made of a resin material not containing a core. Since the insulating layer is made of a resin material not containing a core, the diameter of a via conductor formed in the insulating layer can be reduced. Thus, even when the plurality of terminal elec- (Continued)

trodes are formed in the conductor layer with a small pitch,
the routing distance of wires can be reduced.

19 Claims, 7 Drawing Sheets

(51) Int. Cl.
      *H05K 1/182*          (2026.01)
      *H05K 1/185*          (2026.01)

(58) Field of Classification Search
      CPC ............. H05K 2201/029; H05K 1/186; H05K
                                                   1/183–185
      See application file for complete search history.

(56)                         References Cited

U.S. PATENT DOCUMENTS

| | | | |
|---|---|---|---|
| 2016/0316566 A1 | 10/2016 | Sakai et al. | |
| 2017/0330837 A1* | 11/2017 | Stahr | H01L 21/486 |
| 2018/0033732 A1* | 2/2018 | Sakamoto | H01L 21/486 |
| 2020/0146192 A1* | 5/2020 | Lin | H05K 13/0486 |
| 2022/0248530 A1* | 8/2022 | Mori | H05K 1/111 |

* cited by examiner

ELECTRONIC COMPONENT EMBEDDED SUBSTRATE AND MANUFACTURING METHOD THEREFOR

CROSS REFERENCE TO RELATED APPLICATIONS

This application is the U.S. National Phase under 35 U.S.C. § 371 of International Application No. PCT/JP2022/007194, filed on Feb. 22, 2022, which claims the benefit of Japanese Patent Application No. 2021-046032, filed on Mar. 19, 2021, the entire contents of each are hereby incorporated by reference.

TECHNICAL FIELD

The present invention relates to an electronic component embedded substrate and a manufacturing method therefor and, more particularly, to an electronic component embedded substrate having a multilayer wiring structure and a manufacturing method therefor.

BACKGROUND ART

Patent Document 1 discloses an electronic component embedded substrate having a multilayer wiring structure. The electronic component embedded substrate disclosed in Patent Document 1 has an insulating layer embedding therein an electronic component, two wiring layers provided on one surface side of the insulating layer embedding the electronic component, and two wiring layers provided on the other surface side of the insulating layer embedding the electronic component. The insulating layer positioned between the two wiring layers is made of a core material obtained by impregnating a core such as glass cloth with a resin material, whereby the mechanical strength of the entire substrate is maintained.

CITATION LIST

Patent Document

[Patent Document 1] JP 2006-339421A

DISCLOSURE OF THE INVENTION

Problem to be Solved by the Invention

However, it is difficult to form a fine via hole in a core material obtained by impregnating a core with a resin material, so that the wiring layer formed on the surface of the core material has a low degree of freedom in layout design. In particular, forming a plurality of terminal electrodes with a small pitch requires routing of wires, which may involve an increase in wiring distance.

It is therefore an object of the present invention to provide an electronic component embedded substrate having an enhanced degree of design freedom of an outermost conductor layer including a terminal electrode and a manufacturing method for such an electronic component embedded substrate.

Means for Solving the Problem

An electronic component embedded substrate according to the present invention includes a plurality of conductor layers and a plurality of insulating layers each of which is positioned between two of the plurality of conductor layers that are adjacent in the stacking direction. The plurality of insulating layers include a first insulating layer embedding therein an electronic component. The plurality of conductor layers include first, second, and third conductor layers stacking on one surface side of the first insulating layer and fourth, fifth, and sixth conductor layers stacking on the other surface side of the first insulating layer. The plurality of insulating layers further include a second insulating layer positioned between the first and second conductor layers, a third insulating layer positioned between the second and third conductor layers, a fourth insulating layer positioned between the fourth and fifth conductor layers, and a fifth insulating layer positioned between the fifth and sixth conductor layers. The first conductor layer includes a plurality of terminal electrodes exposed to one surface side of the electronic component embedded substrate, and the sixth conductor layer includes a plurality of terminal electrodes exposed to the other surface side of the electronic component embedded substrate. The third and fourth insulating layers are made of a core material obtained by impregnating a core with a resin material, and at least one of the second and fifth insulating layers is made of a resin material not containing a core.

According to the present invention, since at least one of the second and fifth insulating layers is made of a resin material not containing a core, the diameter of a via conductor formed in at least one of the second and fifth insulating layers can be reduced. Thus, even when a plurality of terminal electrodes are formed in the first or sixth conductor layers with a small pitch, the routing distance of wires can be reduced.

In the present invention, both the second and fifth insulating layers may be made of a resin material not containing a core. This can reduce the diameters of a via conductor formed in each of the second and fifth insulating layers, so that even when a plurality of terminal electrodes are formed in the first or sixth conductor layers with a small pitch, the routing distance of wires can be reduced.

In the present invention, the second and third conductor layers may each include a plurality of signal wiring patterns connected to the electronic component, the third insulating layer may locally include a non-core area not containing a core, the non-core area may have an overlap with the electronic component in a plan view, and the plurality of signal wiring patterns included in the second conductor layer and the plurality of signal wiring patterns included in the third conductor layer may be connected to each other through a plurality of via conductors each penetrating the non-core area. This can reduce the diameters of the plurality of via conductors each penetrating the non-core area.

In the present invention, the first and third conductor layers may each include a plurality of signal wiring patterns connected to the electronic component, the third insulating layer may include an opening, the opening may have an overlap with the electronic component in a plan view, and the plurality of signal wiring patterns included in the first conductor layer and the plurality of signal wiring patterns included in the third conductor layer may be connected to each other through a plurality of via conductors each penetrating the opening. This can reduce the diameters of the plurality of via conductors each penetrating the opening.

An electronic component embedded substrate manufacturing method according to the present invention includes: a step of forming a precursor including a first insulating layer embedding therein an electronic component, first and second conductor layers stacked on one surface side of the first insulating layer, third and fourth conductor layers stacked on the other surface side of the first insulating layer, a second insulating layer positioned between the first and second conductor layers and made of a core material obtained by impregnating a core with a resin material, and a third insulating layer positioned between the third and fourth conductor layers and made of a core material obtained by impregnating a core with a resin material; and a step of forming fifth and sixth conductor layers on the surfaces of the respective first and fourth conductor layers through the respective fourth and fifth insulating layers, wherein at least one of the fourth and fifth insulating layers are made of a resin material not containing a core.

According to the present invention, since at least one of the fourth and fifth insulating layers is made of a resin material not containing a core, the diameter of a via conductor formed in at least one of the fourth and fifth insulating layers can be reduced. Thus, even when a plurality of terminal electrodes are formed in the fifth or sixth conductor layers with a small pitch, the routing distance of wires can be reduced.

In the present invention, both the fourth and fifth insulating layers may be made of a resin material not containing a core. This can reduce the diameters of a via conductor formed in each of the fourth and fifth insulating layers, so that even when a plurality of terminal electrodes are formed in the fifth or sixth conductor layers with a small pitch, the routing distance of wires can be reduced.

The manufacturing method according to the present invention may further include a step of connecting a plurality of signal wiring patterns included in the first conductor layer and a plurality of signal wiring patterns included in the second conductor layer through a plurality of via conductors each penetrating a non-core area not containing a core that the second insulating layer locally includes. This can reduce the diameters of the plurality of via conductors each penetrating the non-core area.

The manufacturing method according to the present invention may further include a step of connecting a plurality of signal wiring patterns included in the fifth conductor layer and a plurality of signal wiring patterns included in the second conductor layer through a plurality of via conductors each penetrating an opening formed in the second insulating layer. This can reduce the diameters of the plurality of via conductors each penetrating the opening.

Advantageous Effects of the Invention

As described above, according to the present invention, there can be provided an electronic component embedded substrate having an enhanced degree of design freedom of an outermost conductor layer including a terminal electrode and a manufacturing method for such an electronic component embedded substrate.

MODE FOR CARRYING OUT THE INVENTION

Hereinafter, preferred embodiments of the present invention will be described in detail with reference to the accompanying drawings.

First Embodiment

Figure 1:
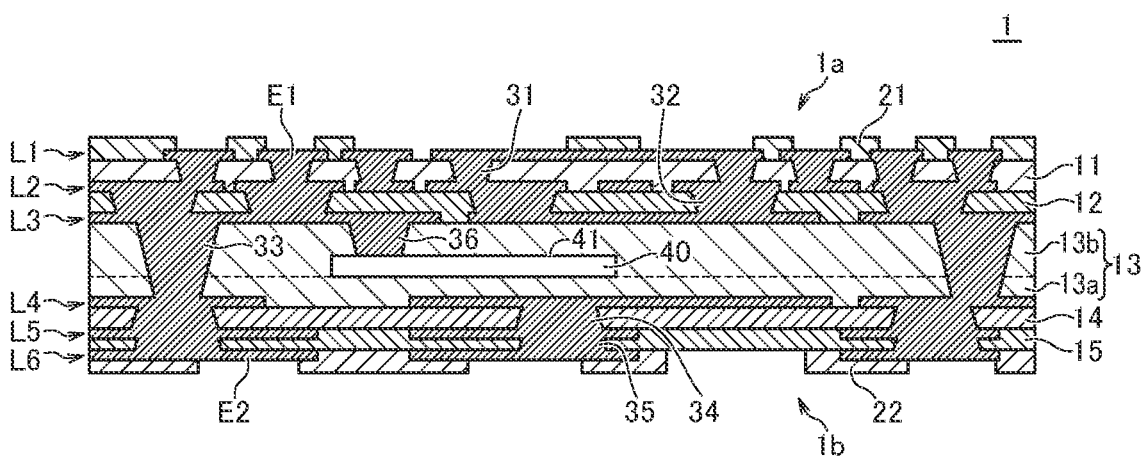
FIG. 1 is a schematic cross-sectional view for explaining the structure of an electronic component embedded substrate 1 according to a first embodiment of the present invention.

FIG. 1 is a schematic cross-sectional view for explaining the structure of an electronic component embedded substrate 1 according to a first embodiment of the present invention.

As illustrated in FIG. 1, the electronic component embedded substrate 1 according to the first embodiment includes six conductor layers L1 to L6 and insulating layers 11 to 15 each of which is positioned between two of the conductor layers L1 to L6 that are adjacent in the stacking direction. Specifically, the insulating layer 11 is positioned between the conductor layers L1 and L2, the insulating layer 12 is positioned between the conductor layers L2 and L3, the insulating layer 13 is positioned between the conductor layers L3 and L4, the insulating layer 14 is positioned between the conductor layers L4 and L5, and the insulating layer 15 is positioned between the conductor layers L5 and L6. All the insulating layers 11 to 15 are an interlayer film on the front and back surface sides of which the conductor layer is present, and in this sense, solder resists 21 and 22 are not considered as the insulating layer.

The conductor layer L1 is positioned in the uppermost layer and is partly covered with a solder resist 21. An exposed part of the conductor layer L1 that is not covered with the solder resist 21 constitutes a terminal electrode E1 positioned on one surface 1*a* side of the electronic component embedded substrate 1. The conductor layer L6 is positioned in the lowermost layer and is partly covered with a solder resist 22. An exposed part of the conductor layer L2 that is not covered with the solder resist 22 constitutes a terminal electrode E2 positioned on the other surface 1*b* side of the electronic component embedded substrate 1. A not-shown electronic component such as a semiconductor IC or a passive component is mounted on the surface 1*a* of the electronic component embedded substrate 1. On the other hand, the surface 1*b* of the electronic component embedded substrate 1 is used as a mounting surface for not-shown another circuit board or mounted with a not-shown electronic component such as a semiconductor IC or a passive component.

Out of the insulating layers 11 to 15, the insulating layers 12, 14, and 15 are made of a core material obtained by impregnating a core such as glass fiber with a resin material such as epoxy. The core material has high strength, and thus the mechanical strength of the electronic component embedded substrate 1 is maintained mainly by the insulating layers 12, 14, and 15. On the other hand, the insulating layers 11 and 13 are made of a resin material not containing a core such as glass cloth. The resin material not containing a core such as glass cloth is advantageous in workability over the core material and allows a small-diameter via hole to be formed therein with a small pitch.

The insulating layer 13 is composed of two insulating layers 13*a* and 13*b*, and an electronic component 40 such as a semiconductor IC is embedded at the interface therebetween. The electronic component 40 is face-up mounted on the surface of the insulating layer 13*a* such that a main surface 41 thereof having an electrode pad thereon faces the surface 1*a* side. When the electronic component 40 is a semiconductor IC, the chip thickness may be reduced to 200 μm or less (e.g., about 50 μm to 100 μm).

As illustrated in FIG. 1, two conductor layers adjacent in the stacking direction are connected to each other through a via conductor. For example, the conductor layers L1 and L2 are connected to each other through a via conductor 31 penetrating the insulating layer 11, the conductor layers L2 and L3 are connected to each other through a via conductor 32 penetrating the insulating layer 12, the conductor layers L3 and L4 are connected to each other through a via conductor 33 penetrating the insulating layer 13, the conductor layers L4 and L5 are connected to each other through a via conductor 34 penetrating the insulating layer 14, and the conductor layers L5 and L6 are connected to each other through a via conductor 35 penetrating the insulating layer 15. Further, the conductor layer L3 and the electronic component 40 are connected to each other through a via conductor 36 penetrating the insulating layer 13*b*.

The insulating layers 12, 14, 15 which are made of a core material and the insulating layers 11, 13 which are made of a resin material not containing a core such as glass cloth significantly differ in workability. That is, it is easy to form a small-diameter via hole in the insulating layers 11 and 13 made of a resin material since they are excellent in workability; on the other hand, the small-diameter via hole is difficult to form in the insulating layers 12, 14, 15 made of a core material due to the presence of a core such as glass cloth. Therefore, the via conductors 32, 34, and 35 penetrating respectively the insulating layers 12, 14, and 15 are inevitably larger in diameter than the via conductors 31 and 33 penetrating respectively the insulating layers 11 and 13. Thus, the via conductors 32, 34, and 35 are difficult to form with a small pitch as compared with the via conductors 31 and 33.

In the present embodiment, the conductor layer L1 positioned in the uppermost layer is formed on the surface of the insulating layer 11 made of a resin material not containing a core such as glass cloth, thus allowing many small-diameter via holes 31 to be formed with a small pitch. Thus, even when the electrode pitch of an electronic component mounted on the one surface 1*a* side is small, routing distance of wires to be formed in the conductor layer L1 can be reduced, facilitating layout design.

As described above, the electronic component embedded substrate 1 according to the present embodiment has the six conductor layers L1 to L6, thus allowing more complicated wiring to be achieved. In addition, the outermost insulating layer 11 positioned on the one surface 1*a* side is made of a resin material not containing a core such as glass cloth, so that even when an electronic component with a small terminal pitch is mounted on the one surface 1*a* side, layout design is facilitated. This effect becomes conspicuous when an electronic component 40 provided with a wire bonding pad requiring many terminals is mounted on the surface layer positioned on the circuit surface side of the embedded electronic component 40 (i.e., on the surface 1*a* side when the electronic component 40 is mounted in a face-up manner). In this case, many wires for connecting the electronic components need to be provided; however, according to the present embodiment, these wires can be arranged with a high density, contributing significantly to miniaturization. In addition, the insulating layers 12, 14, and 15 are made of a core material obtained by impregnating a core with a resin material, making it possible to sufficiently maintaining the mechanical strength of the electronic component embedded substrate 1.

In the present embodiment, the material of the insulating layers 11 and that of the insulating layer 15 differ from each other, and thus there is no symmetry therebetween in the stacking direction. As a result, warpage may occur in the electronic component embedded substrate 1. This is because the insulating layer 11 does not contain a core and thus has a larger thermal expansion coefficient than the insulating layer 15 containing a core. To suppress such warpage, a resin material is selected so as to make the thermal expansion coefficient of the insulating layer 12 smaller than that of the insulating layers 14 and 15. Alternatively, or in addition to this, the thickness of the insulating layer 12 may be made smaller than that of the insulating layers 14 and 15. This enhances the symmetry of the thermal expansion coefficient in the stacking direction, making warpage less likely to occur in the electronic component embedded substrate 1.

The following describes a manufacturing method for the electronic component embedded substrate 1 according to the present embodiment.

FIGS. 2 to 10 are process views for explaining the manufacturing method for the electronic component embedded substrate 1 according to the present embodiment.

Figure 2:
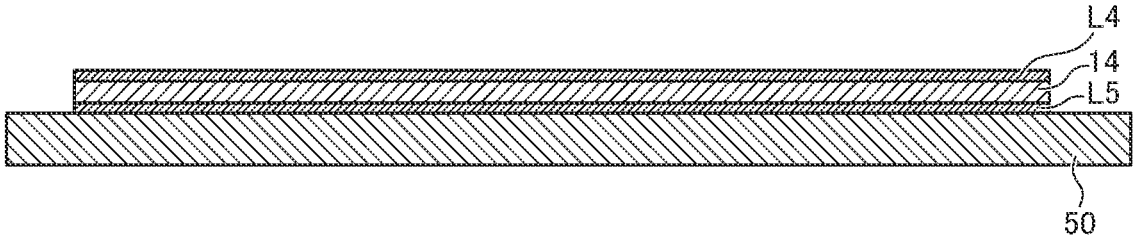
FIG. 2 is a process view for explaining the manufacturing method for the electronic component embedded substrate 1.

As illustrated in FIG. 2, a base material having the conductor layers L4 and L5 made of a Cu foil or the like formed on the insulating layer 14 made of a core material is

Figure 3:
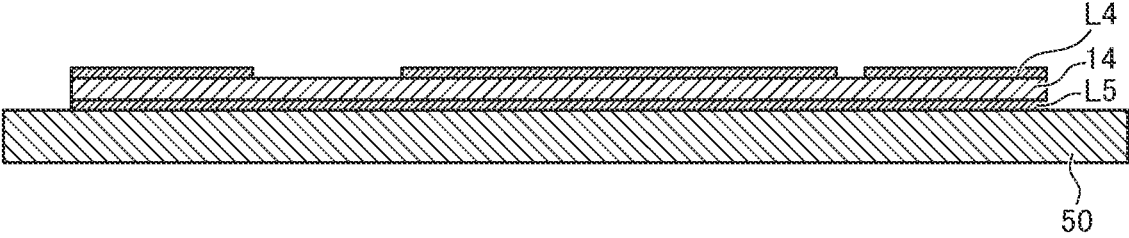
FIG. 3 is a process view for explaining the manufacturing method for the electronic component embedded substrate 1.
Figure 4:
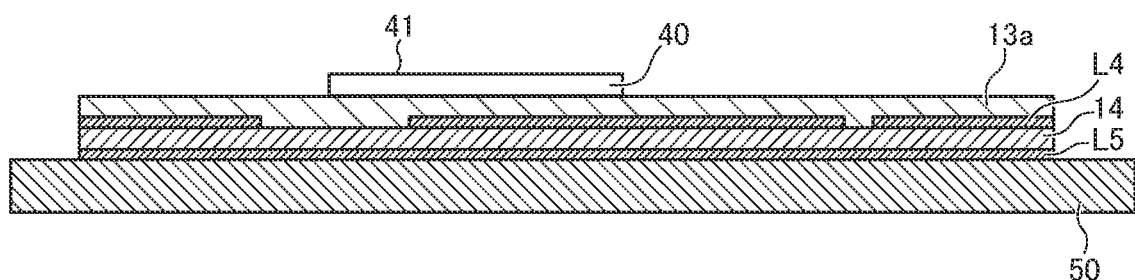
FIG. 4 is a process view for explaining the manufacturing method for the electronic component embedded substrate 1.

7 prepared and fixed on a support 50. Then, as illustrated in FIG. 3, the conductor layer L4 is patterned using a known method such as a photolithography method to complete the conductor layer L4 having a desired pattern shape. Then, as illustrated in FIG. 4, for example, an uncured (B stage) resin sheet or the like is laminated by vacuum pressure bonding or the like on the surface of the insulating layer 14 so as to embed therein the patterned conductor layer L4 to thereby form the insulating layer 13*a*. Then, the electronic component 40 is placed on the surface of the insulating layer 13*a*. The electronic component 40 is face-up mounted such that the main surface 41 from which the electrode pad is exposed faces upward.

Figure 5:
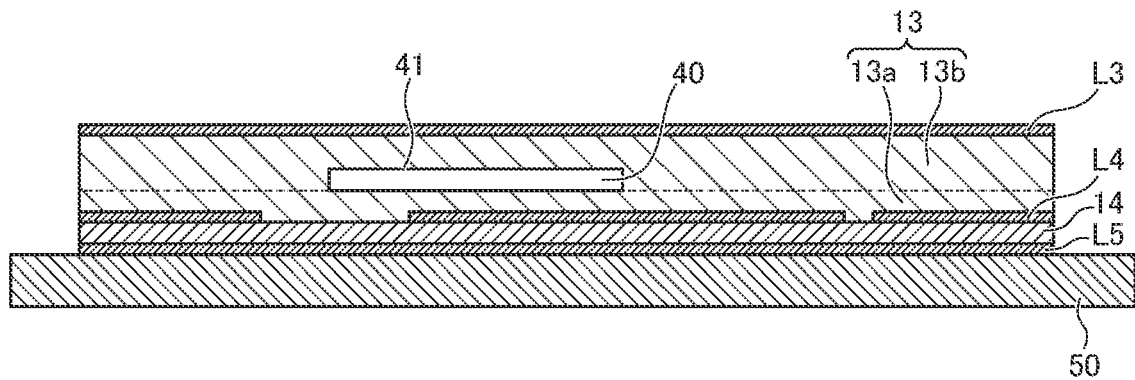
FIG. 5 is a process view for explaining the manufacturing method for the electronic component embedded substrate 1.

Then, as illustrated in FIG. 5, the insulating layer 13*b* and conductor layer L3 are formed so as to cover the electronic component 40. Preferably, the insulating layer 13*b* is formed as follows: after application of an uncured or semi-cured thermosetting resin, the resin (when it is uncured resin) is semi-cured by heating, and then the semi-cured resin and the conductor layer L3 are pressed together by a pressing means to obtain the cured insulating layer 13*b*. The insulating layer 13*b* may be made of the same material as that of the insulating layer 13*a*. The pad size of the embedded electronic component 40 is generally smaller than the size of the terminal electrodes E1 and E2, and thus the pad pitch needs to be designed small, so that it is necessary to form a small-diameter via in the insulating layer formed above the embedded electronic component 40. Considering this, the insulating layer 13*b* is desirably made of a resin material not containing a core such as glass cloth.

Figure 6:
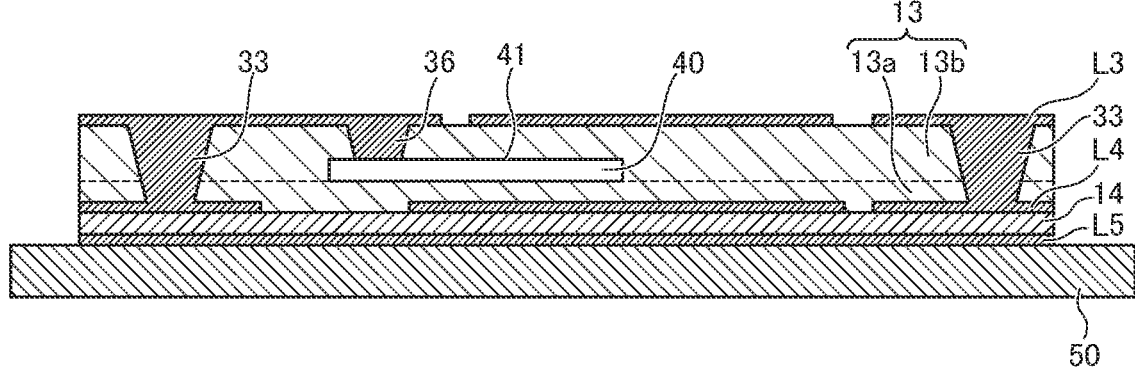
FIG. 6 is a process view for explaining the manufacturing method for the electronic component embedded substrate 1.

Then, as illustrated in FIG. 6, after formation of via holes in the insulating layer 13, the via conductors 33 and 36 filling the via holes are formed. Subsequently, a known method such as a photolithography method is used to pattern the conductor layer L3 to complete the conductor layer L3 having a desired pattern shape. As a result, a part of the conductor layer L3 is connected to the conductor layer L4 through the via conductor 33, and another part thereof is connected to the electronic component 40 through the via conductor 36.

Figure 7:
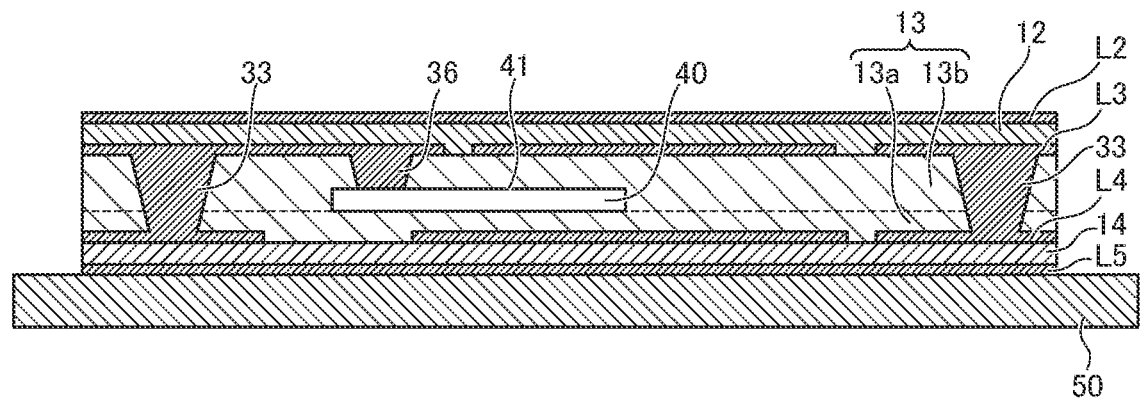
FIG. 7 is a process view for explaining the manufacturing method for the electronic component embedded substrate 1.
Figure 8:
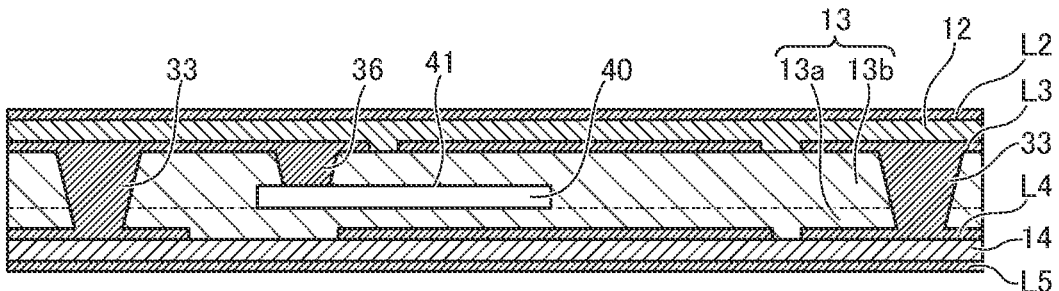
FIG. 8 is a process view for explaining the manufacturing method for the electronic component embedded substrate 1.

Then, as illustrated in FIG. 7, a sheet having the insulating layer 12 and conductor layer L2 laminated thereon is hot-pressed under vacuum so as to embed therein the conductor layer L3. The material and thickness of the insulating layer 12 may be the same as those of the insulating layer 14. Then, as illustrated in FIG. 8, the support 50 is peeled off.

Figure 9:
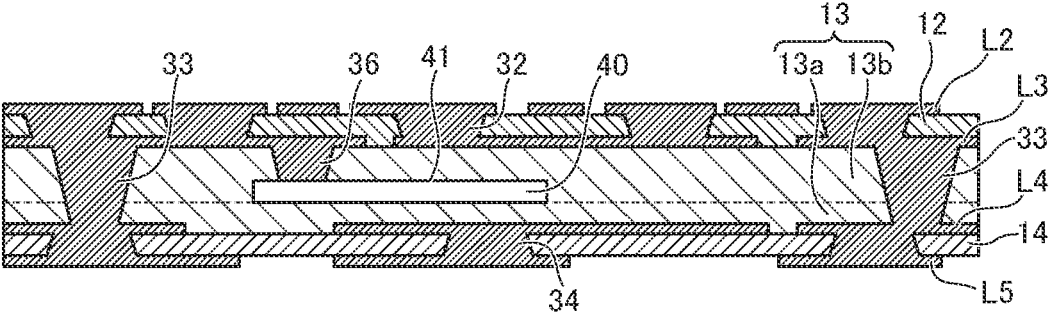
FIG. 9 is a process view for explaining the manufacturing method for the electronic component embedded substrate 1.

Then, as illustrated in FIG. 9, after formation of via holes in the insulating layers 12 and 14, the via conductors 32 and 34 filling the via holes are formed. Subsequently, a known method such as a photolithography method is used to pattern the conductor layers L2 and L5 to complete the conductor layers L2 and L5 each having a desired pattern shape. As a result, a part of the conductor layer L2 is connected to the conductor layer L3 through the via conductor 32, and a part of the conductor layer L5 is connected to the conductor layer L4 through the via conductor 34. When the via holes are formed in the insulating layers 12 and 14, a core existing at the formation positions of the via holes needs to be removed, inevitably increasing the diameter of the via holes. Correspondingly, the via conductors 32 and 34 are increased in diameter. With the above processes, a precursor of the electronic component embedded substrate having four conductor layers L2 to L5 is completed.

Figure 10:
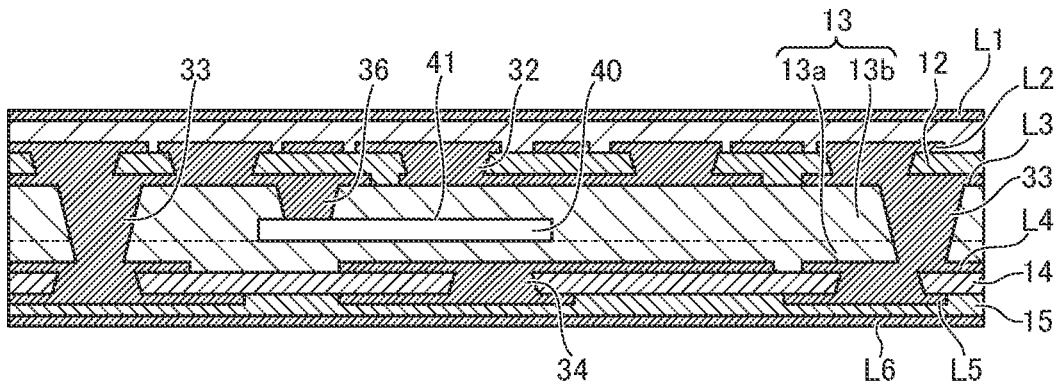
FIG. 10 is a process view for explaining the manufacturing method for the electronic component embedded substrate 1.

Then, as illustrated in FIG. 10, a sheet having the insulating layer 11 and conductor layer L1 laminated thereon and a sheet having the insulating layer 15 and conductor layer L6 are prepared to sandwich the precursor having the conductor layers L2 to L5, followed by vacuum hot pressing. Then, after formation of via holes in the insulating layers 11 and 15, the via conductors 31 and 35 filling the via holes are formed. Subsequently, a known method such as a photolithography method is used to pattern the conductor layers L1 and L6, and the solder resists 21 and 22 are formed. Thus, the electronic component embedded substrate 1 illustrated in FIG. 1 is completed.

The insulating layer 11 does not contain a core such as glass cloth, so that, in the process of forming the via holes in the insulating layer 11, small-diameter via holes can be formed with a small pitch by laser machining or blasting. This enhances the degree of freedom in layout design of the conductor layer L1 as compared to when the insulating layer 11 is made of a core material.

Second Embodiment

Figure 11:
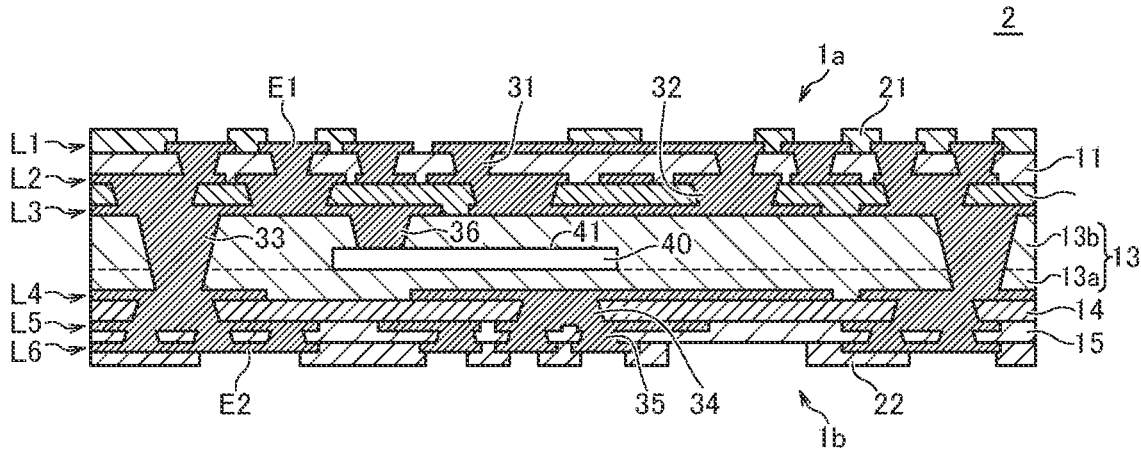
FIG. 11 is a schematic cross-sectional view for explaining the structure of an electronic component embedded substrate 2 according to a second embodiment of the present invention.

FIG. 11 is a schematic cross-sectional view for explaining the structure of an electronic component embedded substrate 2 according to a second embodiment of the present invention.

As illustrated in FIG. 11, the electronic component embedded substrate 2 according to the second embodiment differs from the electronic component embedded substrate 1 according to the first embodiment in that the insulating layer 15 positioned in the lowermost layer is made of a resin material not containing a core such as glass cloth. Other basic configurations are the same as those of the electronic component embedded substrate 1 according to the first embodiment, so the same reference numerals are given to the same elements, and overlapping description will be omitted.

In the present embodiment, since the conductor layer L6 positioned in the lowermost layer is formed on the surface of the insulating layer 15 made of a resin material not containing a core such as glass cloth, many small-diameter via conductors 35 can be formed with a small pitch. Thus, even when the electrode pitch of an electronic component mounted on the other surface 1*b* side is small as in the case of an electronic component mounted on the one surface 1*a* side, layout design for the conductor layer L6 is facilitated.

Third Embodiment

Figure 12:
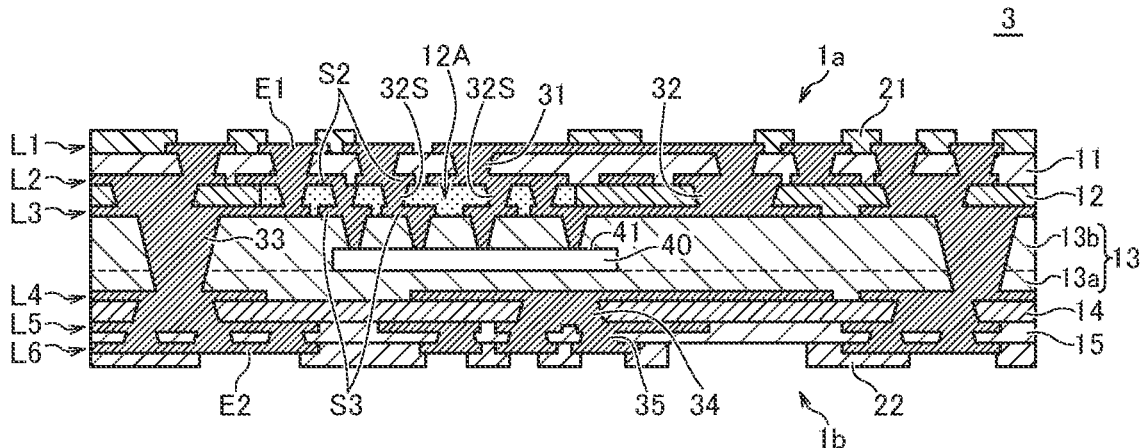
FIG. 12 is a schematic cross-sectional view for explaining the structure of an electronic component embedded substrate 3 according to a third embodiment of the present invention.

FIG. 12 is a schematic cross-sectional view for explaining the structure of an electronic component embedded substrate 3 according to a third embodiment of the present invention.

As illustrated in FIG. 12, the electronic component embedded substrate 3 according to the third embodiment differs from the electronic component embedded substrate 2 according to the second embodiment in that the insulating layer 12 locally has non-core areas 12A containing no core. Other basic configurations are the same as those of the electronic component embedded substrate 2 according to the second embodiment, so the same reference numerals are given to the same elements, and overlapping description will be omitted.

In the example illustrated in FIG. 12, the non-core areas 12A are provided at positions overlapping the electronic component 40 in a plan view. Signal terminals of the electronic component 40 are connected respectively to a plurality of signal wiring patterns S3 included in the conductor layer L3 through the via conductors 36, and the signal wiring patterns S3 of the conductor layer L3 are connected to a plurality of signal wiring patterns S2 included in the conductor layer L2 through via conductors 32S. The signal wiring patterns S2 and S3 are connected to each other through the plurality of via conductors 32S penetrating the non-core areas 12A. As described above, the non-core areas 12A do not contain a core, so that the diameter and pitch of the via conductors 32S formed in the non-core areas 12A can be made smaller than those of the via conductors 32 formed in other areas of the insulating layer 12.

Thus, even when the electronic component 40 has many signal terminals, they can be connected to the conductor layer L1 at a shortest distance without making the signal wiring patterns S2 and S3 detour.

The following describes a manufacturing method for the electronic component embedded substrate 3 according to the present embodiment.

FIGS. 13 to 16 are process views for explaining the manufacturing method for the electronic component embedded substrate 3 according to the present embodiment.

Figure 13:
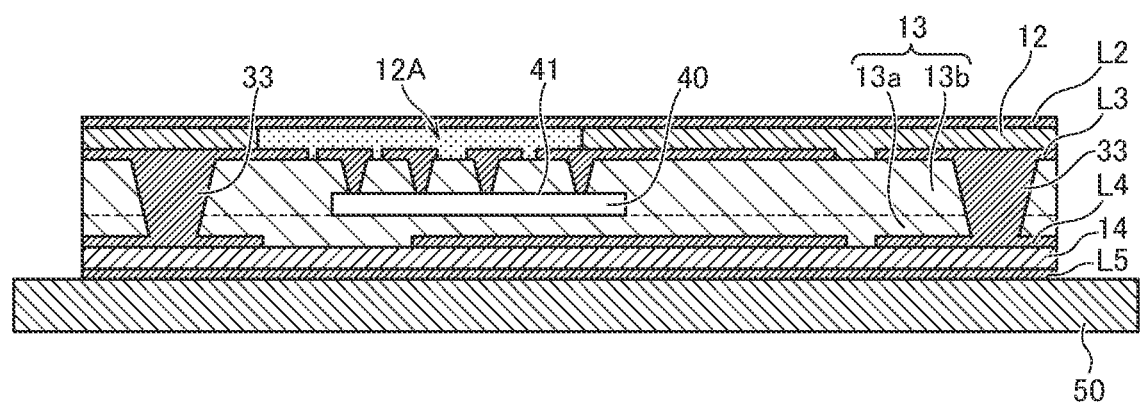
FIG. 13 is a process view for explaining the manufacturing method for the electronic component embedded substrate 3.
Figure 14:
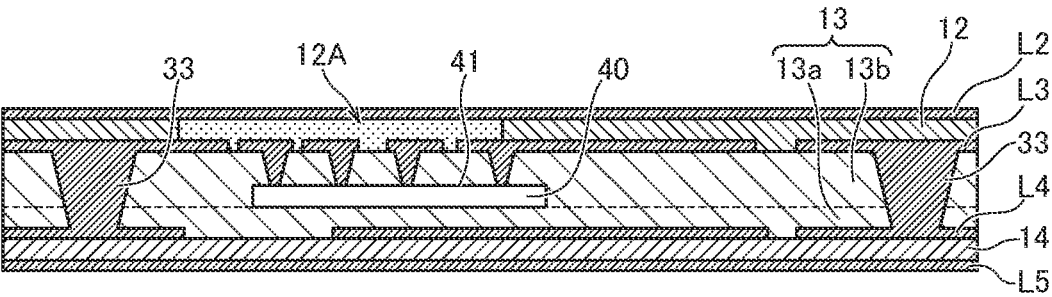
FIG. 14 is a process view for explaining the manufacturing method for the electronic component embedded substrate 3.

After performing the processes described using FIGS. 2 to 6, a sheet that has the insulating layer 12 having the non-core areas 12A and the conductor layer L2 laminated thereon is hot-pressed under vacuum, as illustrated in FIG. 13. The non-core areas 12A are positioned so as to overlap the signal wiring patterns S3 included in the conductor layer L3. Thereafter, the support 50 is peeled off as illustrated in FIG. 14. The non-core areas 12A may be formed through punching by means of a metal mold press, or drilling or laser machining in an uncured state of the insulating layer 12 before the vacuum hot pressing.

Figure 15:
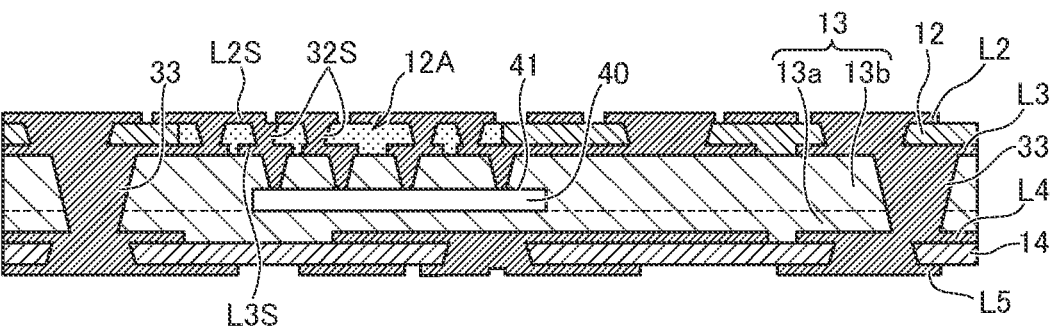
FIG. 15 is a process view for explaining the manufacturing method for the electronic component embedded substrate 3.

Then, as illustrated in FIG. 15, after formation of via holes in the insulating layers 12 and 14, the via conductors 32 and 34 filling the via holes are formed. Subsequently, a known method such as a photolithography method is used to pattern the conductor layers L2 and L5 to thereby complete the conductor layers L2 and L5 having a desired pattern shape. As a result, the signal wiring patterns S3 included in the conductor layer L2 are connected to the signal wiring patterns S3 of the conductor layer L3 through the via conductors 32S.

Figure 16:
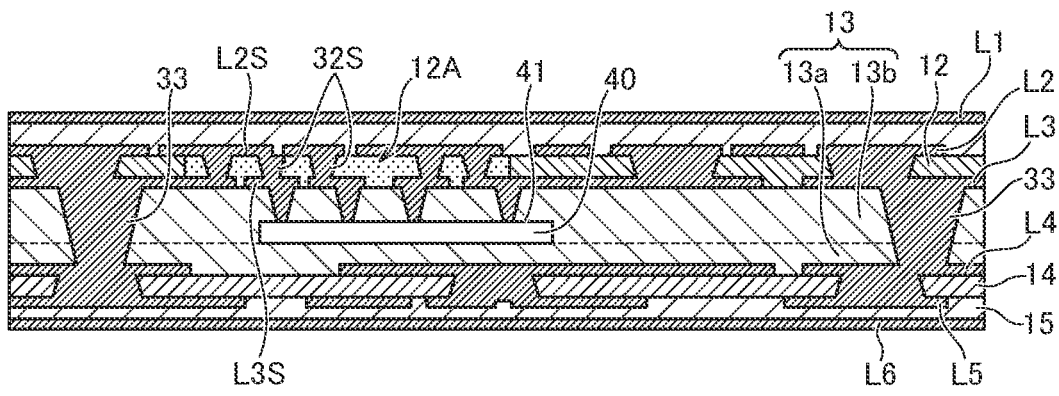
FIG. 16 is a process view for explaining the manufacturing method for the electronic component embedded substrate 3.

Then, as illustrated in FIG. 16, a sheet having the insulating layer 11 and conductor layer L1 laminated thereon and a sheet having the insulating layer 15 and conductor layer L6 laminated thereon are used to sandwich the precursor, followed by vacuum hot pressing. Then, after formation of via holes in the insulating layers 11 and 15, the via conductors 31 and 35 filling the via holes are formed. Subsequently, a known method such as a photolithography method is used to pattern the conductor layers L1 and L6, and the solder resists 21 and 22 are formed. Thus, the electronic component embedded substrate 3 illustrated in FIG. 12 is completed.

As described above, in the present embodiment, the non-core areas 12A not containing a core such as glass cloth are formed in the insulating layer 12, so that it is possible to reduce the diameter and pitch of the via conductors 32S while maintaining the mechanical strength of the insulating layer 12.

Fourth Embodiment

Figure 17:
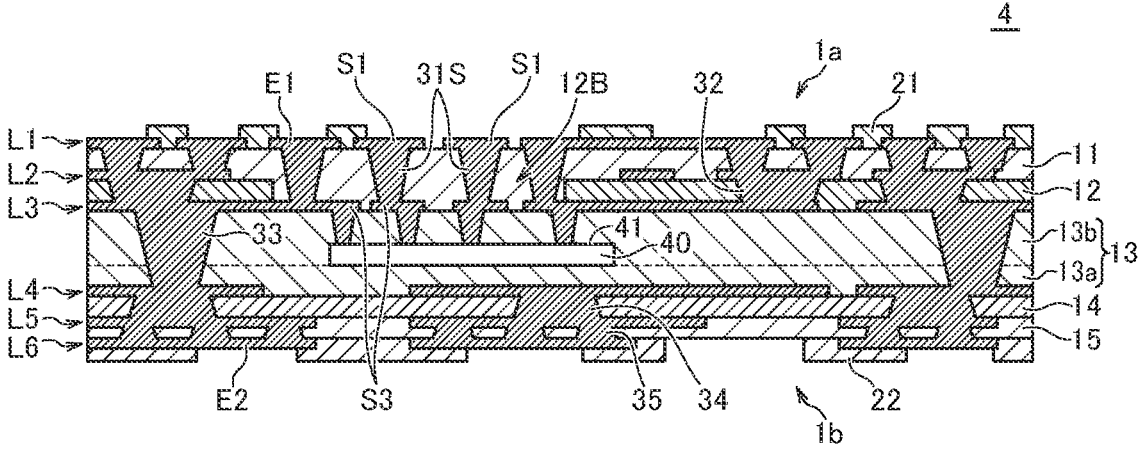
FIG. 17 is a schematic cross-sectional view for explaining the structure of an electronic component embedded substrate 4 according to a fourth embodiment of the present invention.

FIG. 17 is a schematic cross-sectional view for explaining the structure of an electronic component embedded substrate 4 according to a fourth embodiment of the present invention.

As illustrated in FIG. 17, the electronic component embedded substrate 4 according to the fourth embodiment differs from the electronic component embedded substrate 2 according to the second embodiment in that openings 12B are formed in the insulating layer 12. Other basic configurations are the same as those of the electronic component embedded substrate 2 according to the second embodiment, so the same reference numerals are given to the same elements, and overlapping description will be omitted.

In the example illustrated in FIG. 17, the openings 12B are formed at positions overlapping the electronic component 40 in a plan view. The openings 12B are areas in which the insulating layer 12 does not exist (i.e., areas from which the insulating layer 12 is removed) and are filled with the insulating layer 11. In the present embodiment, the signal terminals of the electronic component 40 are connected to the plurality of signal wiring patterns S3 included in the conductor layer L3 through the via conductors 36, and the signal wiring patterns S3 of the conductor layer L3 are connected to the plurality of signal wiring patterns S1 included in the conductor layer L1 through via conductors 31S. The signal wiring patterns S1 and S3 are connected to each other through the plurality of via conductors 31S penetrating the openings 12B. As described above, the openings 12B have no insulating layer 12 and are filled with the insulating layer 11, so that the diameter and pitch of the via conductors 31S formed in the openings 12B can be made smaller than those of the via conductors 32 formed in the insulating layer 12.

Thus, as in the case of the third embodiment, even when the electronic component 40 has many signal terminals, they can be connected to the conductor layer L1 at a shortest distance without making the signal wiring patterns S2 and S3 detour. In addition, the via conductors 31S each directly connects the signal wiring patterns S1 and S3, thereby further reducing the wiring distance between the electronic component 40 and the terminal electrode E1.

The following describes a manufacturing method for the electronic component embedded substrate 4 according to the present embodiment.

Figure 18:
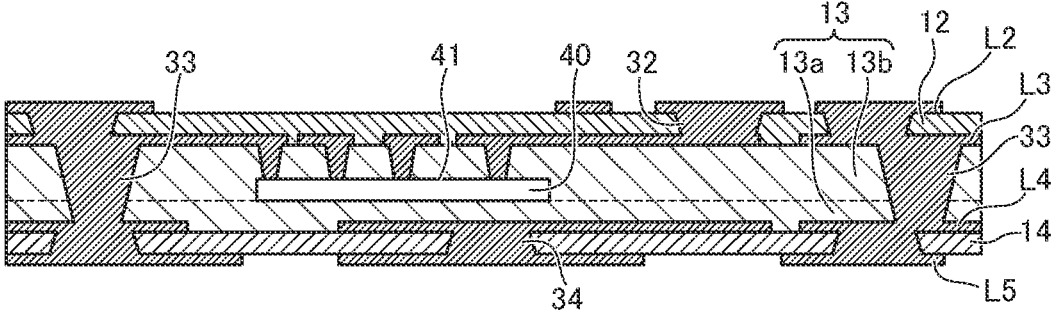
FIG. 18 is a process view for explaining the manufacturing method for the electronic component embedded substrate 4.
Figure 19:
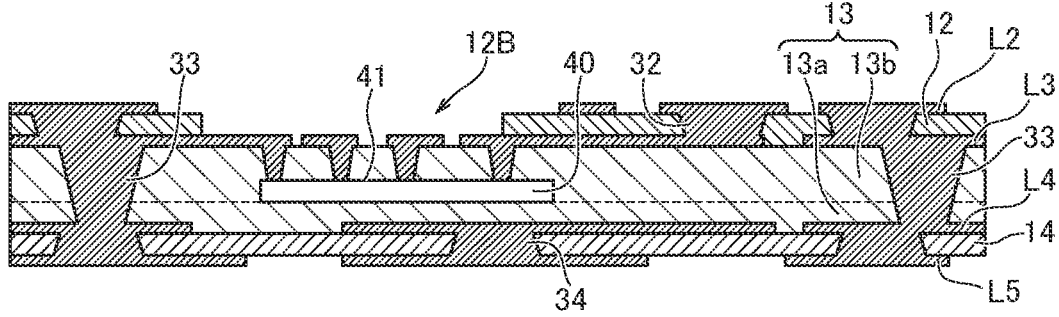
FIG. 19 is a process view for explaining the manufacturing method for the electronic component embedded substrate 4.
Figure 20:
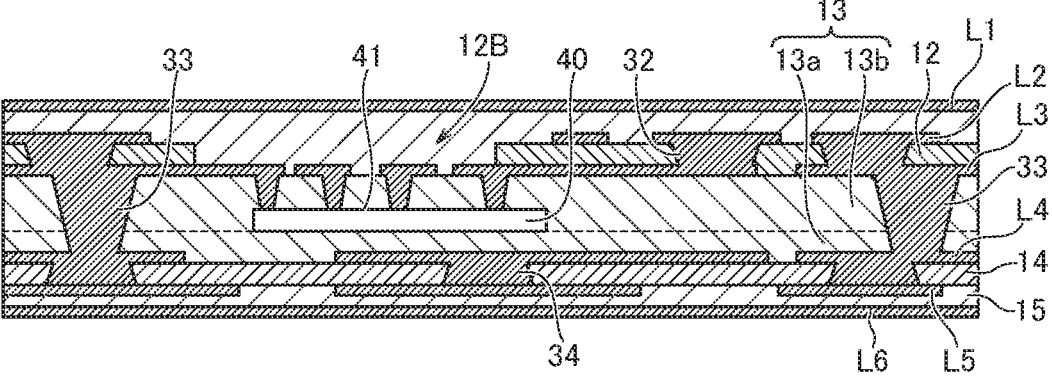
FIG. 20 is a process view for explaining the manufacturing method for the electronic component embedded substrate 4.

FIGS. 18 to 20 are process views for explaining the manufacturing method for the electronic component embedded substrate 4 according to the present embodiment.

After performing the processes described using FIGS. 2 to 8, the conductor layers L2 and L5 are patterned to complete the conductor layers L2 and L5 each having a desired pattern shape, as illustrated in FIG. 18. At this time, the conductor layer L2 on the insulating layer L2 is completely removed from areas where the openings 12B are to be formed. Then, as illustrated in FIG. 19, a known technique such as drilling or laser machining is used to partly remove the insulating layer 12 to thereby form the openings 12B.

Then, as illustrated in FIG. 20, the precursor is sandwiched by a sheet having the insulating layer 11 and conductor layer L1 laminated thereon and a sheet having the insulating layer 15 and conductor layer L6 laminated thereon, followed by vacuum hot pressing. Then, after formation of via holes in the insulating layers 11 and 15, the via conductors 31 and 35 filling the via holes are formed. Subsequently, a known method such as a photolithography method is used to pattern the conductor layers L1 and L6, and the solder resists 21 and 22 are formed. Thus, the electronic component embedded substrate 4 illustrated in FIG. 17 is completed.

As described above, according to the present embodiment, the openings 12B are formed in the insulating layer 12, so that it is possible to reduce the diameter and pitch of the via conductors 31S while maintaining the mechanical strength of the insulating layer 12.

While the preferred embodiment of the present disclosure has been described, the present disclosure is not limited to the above embodiment, and various modifications may be made within the scope of the present disclosure, and all such modifications are included in the present disclosure.

REFERENCE SIGNS LIST 1-4 electronic component embedded substrate
1a one surface side of electronic component embedded substrate
1b the other surface side of electronic component embedded substrate
11-15, 13a, 13b insulating layer
12A non-core area
12B opening
21, 22 solder resist
31-36, 31S, 32S
40 electronic component
41 main surface of electronic component
50 support
E1, E2 terminal electrode
L1-L6 conductor layer
S1-S3 signal wiring pattern

What is claimed is:

1. An electronic component embedded substrate comprising:
  a plurality of conductor layers; and
  a plurality of insulating layers each of which is positioned between two of the plurality of conductor layers that are adjacent in a stacking direction,
  wherein the plurality of insulating layers include a first insulating layer embedding therein an electronic component and being made of a resin material not containing a core,
  wherein the plurality of conductor layers include first, second, and third conductor layers stacking on one surface side of the first insulating layer and fourth, fifth, and sixth conductor layers stacking on other surface side of the first insulating layer,
  wherein the plurality of insulating layers further include a second insulating layer positioned between the first and second conductor layers, a third insulating layer positioned between the second and third conductor layers a fourth insulating layer positioned between the fourth and fifth conductor layers, and a fifth insulating layer positioned between the fifth and sixth conductor layers,
  wherein the first conductor layer includes a plurality of terminal electrodes exposed to one surface side of the electronic component embedded substrate,
  wherein the sixth conductor layer includes a plurality of terminal electrodes exposed to other surface side of the electronic component embedded substrate,
  wherein each of the third and fourth insulating layers includes a core material and the resin material,
  wherein at least one of the second and fifth insulating layers is made of the resin material not containing the core,
  wherein the fourth conductor layer is formed on one surface of the fourth insulating layer such that the fourth conductor layer is embedded in the first insulating layer without embedded in the fourth insulating layer, and
  wherein the fifth conductor layer is formed on another surface of the fourth insulating layer such that the fifth conductor layer is embedded in the fifth insulating layer without embedded in the fourth insulating layer.

2. The electronic component embedded substrate as claimed in claim 1, wherein both the second and fifth insulating layers are made of a resin material not containing a core.

3. The electronic component embedded substrate as claimed in claim 1,
  wherein each of the second and third conductor layers includes a plurality of signal wiring patterns connected to the electronic component,
  wherein the third insulating layer locally includes a non-core area not containing a core,
  wherein the non-core area has an overlap with the electronic component in a plan view, and
  wherein the plurality of signal wiring patterns included in the second conductor layer and the plurality of signal wiring patterns included in the third conductor layer are connected to each other through a plurality of via conductors each penetrating the non-core area.

4. The electronic component embedded substrate as claimed in claim 1,
  wherein each of the first and third conductor layers includes a plurality of signal wiring patterns connected to the electronic component,
  wherein the third insulating layer includes an opening,
  wherein the opening has an overlap with the electronic component in a plan view, and
  wherein the plurality of signal wiring patterns included in the first conductor layer and the plurality of signal wiring patterns included in the third conductor layer are connected to each other through a plurality of via conductors each penetrating the opening.

5. The electronic component embedded substrate as claimed in claim 2,
  wherein each of the second and third conductor layers includes a plurality of signal wiring patterns connected to the electronic component,
  wherein the third insulating layer locally includes a non-core area not containing a core,
  wherein the non-core area has an overlap with the electronic component in a plan view, and
  wherein the plurality of signal wiring patterns included in the second conductor layer and the plurality of signal wiring patterns included in the third conductor layer are connected to each other through a plurality of via conductors each penetrating the non-core area.

6. The electronic component embedded substrate as claimed in claim 2,
  wherein each of the first and third conductor layers includes a plurality of signal wiring patterns connected to the electronic component,
  wherein the third insulating layer includes an opening,
  wherein the opening has an overlap with the electronic component in a plan view, and
  wherein the plurality of signal wiring patterns included in the first conductor layer and the plurality of signal wiring patterns included in the third conductor layer are connected to each other through a plurality of via conductors each penetrating the opening.

7. The electronic component embedded substrate as claimed in claim 1, wherein one of the second and fifth insulating layers includes a core material and a resin material.

8. The electronic component embedded substrate as claimed in claim 1, further comprising a via conductor connected between the fourth conductor layer and the fifth conductor layer, wherein the via conductor is a same in thickness as the fourth insulating layer.

9. The electronic component embedded substrate as claimed in claim 1, wherein the third insulating layer is divided into a core area including a core and a non-core area not containing a core.

10. The electronic component embedded substrate as claimed in claim 9, wherein the non-core area at least partially overlaps the electronic component.

11. The electronic component embedded substrate as claimed in claim 10, wherein a part of the non-core area does not overlap the electronic component.

12. The electronic component embedded substrate as claimed in claim 9, further comprising:

a first via conductor connected between the second conductive layer and the third conductive layer to penetrate the non-core area of the third insulating layer; and a second via conductor connected between the second conductive layer and the third conductive layer to penetrate the core area of the third insulating layer.

13. The electronic component embedded substrate as claimed in claim 12, wherein the first via conductor is smaller in diameter than the second via conductor.

14. The electronic component embedded substrate as claimed in claim 1, wherein the third insulating layer includes an opening filled with a resin material of the second insulating layer.

15. The electronic component embedded substrate as claimed in claim 14, further comprising:

a first via conductor connected between the first conductive layer and the third conductive layer to penetrate the second insulating layer and the opening of the third insulating layer; and a second via conductor connected between the second conductive layer and the third conductive layer to penetrate the third insulating layer.

16. The electronic component embedded substrate as claimed in claim 15, wherein the first via conductor is smaller in diameter than the second via conductor.

17. An electronic component embedded substrate comprising:

a plurality of conductor layers; and a plurality of insulating layers each of which is positioned between two of the plurality of conductor layers that are adjacent in a stacking direction, wherein the plurality of insulating layers include a first insulating layer embedding therein an electronic component, wherein the plurality of conductor layers include first, second, and third conductor layers stacking on one surface side of the first insulating layer and fourth, fifth, and sixth conductor layers stacking on other surface side of the first insulating layer, wherein the plurality of insulating layers further include a second insulating layer positioned between the first and second conductor layers, a third insulating layer positioned between the second and third conductor layers, a fourth insulating layer positioned between the fourth and fifth conductor layers, and a fifth insulating layer positioned between the fifth and sixth conductor layers, wherein the first conductor layer includes a plurality of terminal electrodes exposed to one surface side of the electronic component embedded substrate, wherein the sixth conductor layer includes a plurality of terminal electrodes exposed to other surface side of the electronic component embedded substrate, wherein each of the third, fourth, and fifth insulating layers includes a core material and a resin material, and wherein the second insulating layer is made of a resin material not containing a core, wherein the electronic component embedded substrate further comprises:

a first via conductor connected between the first conductive layer and the second layer to penetrate the second insulating layer; and a second via conductor connected between the fifth conductive layer and the sixth conductive layer to penetrate the fifth insulating layer, and wherein the first via conductor is smaller in diameter than the second via conductor.

18. An electronic component embedded substrate comprising:

a plurality of conductor layers; and a plurality of insulating layers each of which is positioned between two of the plurality of conductor layers that are adjacent in a stacking direction, wherein the plurality of insulating layers include a first insulating layer embedding therein an electronic component and being made of a resin material not containing a core, wherein the plurality of conductor layers include first, second, and third conductor layers stacking on one surface side of the first insulating layer and fourth, fifth, and sixth conductor layers stacking on other surface side of the first insulating layer, wherein the plurality of insulating layers further include a second insulating layer positioned between the first and second conductor layers, a third insulating layer positioned between the second and third conductor layers, a fourth insulating layer positioned between the fourth and fifth conductor layers, and a fifth insulating layer positioned between the fifth and sixth conductor layers, wherein the first conductor layer includes a plurality of terminal electrodes exposed to one surface side of the electronic component embedded substrate, wherein the sixth conductor layer includes a plurality of terminal electrodes exposed to other surface side of the electronic component embedded substrate, wherein each of the third and fourth insulating layers includes a core material and the resin material, wherein at least one of the second and fifth insulating layers is made of the resin material not containing the core, wherein the third insulating layer is divided into a core area including a core and a non-core area not containing a core, wherein the electronic component embedded substrate further comprises:

a first via conductor connected between the second conductive layer and the third conductive layer to penetrate the non-core area of the third insulating layer; and a second via conductor connected between the second conductive layer and the third conductive layer to penetrate the core area of the third insulating layer.

19. An electronic component embedded substrate comprising:

a plurality of conductor layers; and a plurality of insulating layers each of which is positioned between two of the plurality of conductor layers that are adjacent in a stacking direction,

wherein the plurality of insulating layers include a first insulating layer embedding therein an electronic component and being made of a resin material not containing a core, wherein the plurality of conductor layers include first, 5 second, and third conductor layers stacking on one surface side of the first insulating layer and fourth, fifth, and sixth conductor layers stacking on other surface side of the first insulating layer, wherein the plurality of insulating layers further include a 10 second insulating layer positioned between the first and second conductor layers, a third insulating layer positioned between the second and third conductor layers, a fourth insulating layer positioned between the fourth and fifth conductor layers, and a fifth insulating layer 15 positioned between the fifth and sixth conductor layers, wherein the first conductor layer includes a plurality of terminal electrodes exposed to one surface side of the electronic component embedded substrate, wherein the sixth conductor layer includes a plurality of terminal electrodes exposed to other surface side of the electronic component embedded substrate, wherein each of the third and fourth insulating layers includes a core material and the resin material, wherein at least one of the second and fifth insulating layers is made of the resin material not containing the core, and wherein the third insulating layer includes an opening filled with a resin material of the second insulating layer.

* * * * *